(12) United States Patent
Gluschenkov et al.

(10) Patent No.: US 10,930,780 B2
(45) Date of Patent: Feb. 23, 2021

(54) LOW PARASITIC CAPACITANCE AND RESISTANCE FINFET DEVICE

(71) Applicant: International Business Machines Corporation, Armonk, NY (US)

(72) Inventors: Oleg Gluschenkov, Tannersville, NY (US); Ahmet S. Ozcan, Chappaqua, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/442,645

(22) Filed: Jun. 17, 2019

(65) Prior Publication Data

US 2019/0305131 A1     Oct. 3, 2019

Related U.S. Application Data

(62) Division of application No. 14/740,411, filed on Jun. 16, 2015, now Pat. No. 10,374,088.

(51) Int. Cl.
*H01L 29/08*     (2006.01)
*H01L 29/66*     (2006.01)
(Continued)

(52) U.S. Cl.
CPC ...... *H01L 29/7845* (2013.01); *H01L 29/0847* (2013.01); *H01L 29/41791* (2013.01); (Continued)

(58) Field of Classification Search
CPC ..... H01L 29/40; H01L 29/413; H01L 29/267; H01L 29/7845; H01L 29/4933; H01L 29/4975; H01L 29/41783; H01L 29/41791; H01L 29/785; H01L 29/0847; H01L 29/66795; H01L 29/665; H01L 29/66507; H01L 29/165; H01L 21/28052; H01L 21/28518; H01L 21/32137;
(Continued)

(56) References Cited

U.S. PATENT DOCUMENTS 7,915,693 B2    3/2011   Okano
8,278,196 B2   10/2012   Huang et al.
(Continued)

*Primary Examiner* — Natalia A Gondarenko
(74) *Attorney, Agent, or Firm* — Scully, Scott, Murphy & Presser, P.C.; L. Jeffrey Kelly, Esq.

(57) ABSTRACT

Described herein is a semiconductor structure and method of manufacture. The semiconductor structure includes a plurality of semiconductor fins on a substrate and a plurality of raised active regions, wherein each raised active region is located on sidewalls of a corresponding semiconductor fin among said plurality of semiconductor fins. The raised active regions are laterally spaced from any other of the raised active regions. Each raised active region comprises angled sidewall surfaces that are not parallel or perpendicular to a topmost horizontal surface of said substrate. The raised active regions are silicon germanium (SiGe). The semiconductor structure includes a metal semiconductor alloy region contacting at least said angled sidewall surfaces of at least two adjacent raised active regions. The semiconductor alloy region includes a material selected from the group consisting of nickel silicide, nickel-platinum silicide and cobalt silicide.

12 Claims, 10 Drawing Sheets

(51) Int. Cl.
*H01L 21/324* (2006.01)
*H01L 21/8234* (2006.01)
*H01L 29/78* (2006.01)
*H01L 29/417* (2006.01)
*H01L 29/165* (2006.01)

(52) U.S. Cl.
CPC ...... *H01L 29/665* (2013.01); *H01L 29/66795* (2013.01); *H01L 29/785* (2013.01); *H01L 29/165* (2013.01)

(58) Field of Classification Search
CPC ......... H01L 21/76843; H01L 21/76802; H01L 21/76887; H01L 21/76879; H01L 21/76889; H01L 21/6805; H01L 21/823425; H01L 21/823443; H01L 23/485; H01L 23/4855; H01L 23/422; H01L 23/481; H01L 23/5384; H01L 21/02381; H01L 21/0245; H01L 21/02532; H01L 21/2652; H01L 21/823412; H01L 21/22; H01L 21/225; H01L 21/2256; H01L 21/2253; H01L 21/28176; H01L 21/2855; H01L 21/2818; H01L 21/32053; H01L 21/8232; H01L 21/823807; H01L 21/8234; H01L 21/823418; H01L 21/8238; H01L 21/823821; H01L 21/823814; H01L 21/84; H01L 29/0878; H01L 29/66; H01L 29/66636; H01L 29/66628; H01L 29/66484; H01L 29/6659; H01L 29/66477; H01L 29/78618; H01L 29/78

USPC ........ 257/344, 401; 438/283, 478, 197, 300, 438/513, 530, 682, 926

See application file for complete search history.

(56) References Cited

U.S. PATENT DOCUMENTS

| | | |
|---|---|---|
| 2011/0227162 A1 | 9/2011 | Lin et al. |
| 2011/0298058 A1 | 12/2011 | Kawasaki et al. |
| 2014/0203370 A1 | 7/2014 | Maeda et al. |
| 2015/0035023 A1 | 2/2015 | Kim et al. |
| 2015/0041918 A1 | 2/2015 | Wann et al. |
| 2015/0072494 A1 | 3/2015 | Lin et al. |
| 2015/0076607 A1 | 3/2015 | Alptekin et al. |
| 2015/0179645 A1* | 6/2015 | Liao .................. H01L 27/0886 257/77 |
| 2015/0206942 A1 | 7/2015 | Glass et al. |
| 2015/0372142 A1 | 12/2015 | Kuang et al. |

* cited by examiner

US 10,930,780 B2

LOW PARASITIC CAPACITANCE AND RESISTANCE FINFET DEVICE

FIELD OF INVENTION

The present disclosure relates to a semiconductor structure, and particularly to fin field effect transistors including metal semiconductor alloy portions, and a method of manufacturing the same.

BACKGROUND

State-of-the art complementary metal oxide semiconductor (CMOS) devices employ fin field effect transistors (fin-FET). One of the design choices is whether raised active regions formed by selective epitaxy are to be merged with one another or remain unmerged. Each choice offers advantages and disadvantages. On one hand, fin field effect transistors including unmerged raised active regions benefit from lower contact resistance and improved direct current (DC) performance due to increased silicide contact areas corresponding to wrapping around of the silicides around the faceted surfaces of the unmerged raised active regions. On the other hand, fin field effect transistors including merged raised active regions benefit from reduced parasitic capacitance between a gate electrode and contact via structures due to the reduction in the number of contact via structures.

Another yield challenge with finFET devices is nickel silicide encroachment. If over-etching occurs nickel can encroach on silicon fins which results in short circuits and defective devices.

Thus, a method and a structure are desired for simultaneously reducing the occurrence of over-etching and nickel encroachment and thereby reducing the occurrence of defective devices.

BRIEF SUMMARY

According to one embodiment, a semiconductor structure is disclosed. The semiconductor structure includes a plurality of semiconductor fins on a substrate and a plurality of raised active regions, wherein each raised active region is located on sidewalls of a corresponding semiconductor fin among said plurality of semiconductor fins. The raised active regions are laterally spaced from any other of the raised active regions. Each raised active region comprises angled sidewall surfaces that are not parallel or perpendicular to a topmost horizontal surface of said substrate. The raised active regions are silicon germanium (SiGe). The semiconductor structure includes a metal semiconductor alloy region contacting at least said angled sidewall surfaces of at least two adjacent raised active regions. The semiconductor alloy region includes a material selected from the group consisting of nickel silicide, nickel-platinum silicide and cobalt silicide.

In another embodiment, the invention provides a method of forming a semiconductor structure. The method includes forming a plurality of semiconductor fins on a substrate and forming a plurality of raised active regions on the plurality of semiconductor fins. Each raised active region is laterally spaced from any other raised active region. Each raised active region includes silicon germanium (SiGe) or germanium (Ge). The method includes forming a silicon cap over the raised active regions. The method includes depositing a gate dielectric material over the raised active regions. The method includes etching gate openings between adjacent raised active regions having the silicon cap. The method includes forming a contiguous metal semiconductor alloy selected from the group consisting of nickel silicide, nickel-platinum silicide and cobalt silicide through salicidation of the silicon cap through the gate openings. The method includes depositing metal vias in the gate openings.

In still another embodiment, the invention provides a semiconductor structure including a plurality of silicon semiconductor fins on a substrate. The semiconductor structure includes a plurality of raised active regions, wherein each raised active region is disposed on sidewalls of a corresponding silicon semiconductor fin among the plurality of silicon semiconductor fins, and is laterally spaced from any other of the raised active regions. Each raised active region includes angled sidewall surfaces that are not parallel or perpendicular to a topmost horizontal surface of said substrate wherein the raised active regions are silicon germanium (SiGe), wherein an amount of germanium in the silicon germanium is greater than 30 weight percent, including pure germanium. The semiconductor structure includes a metal semiconductor alloy region contacting at least the angled sidewall surfaces of at least two adjacent raised active regions wherein the semiconductor alloy region includes a material selected from the group consisting of nickel silicide, nickel-platinum silicide and cobalt silicide.

The illustrative aspects of the present invention are designed to solve the problems herein described and other problems not discussed, which are discoverable by a skilled artisan.

BRIEF DESCRIPTION OF THE DRAWINGS

These and other features of embodiments of the invention will be more readily understood from the following detailed description of the various aspects of the invention taken in conjunction with the accompanying drawings that depict various embodiments of the invention, in which.

It is noted that the drawings are not to scale. The drawings are intended to depict only typical aspects of the invention, and therefore should not be considered as limiting the scope of the invention. In the drawings, like numbering represents like elements among the drawings.

DETAILED DESCRIPTION OF THE EMBODIMENTS

Figure 1A:
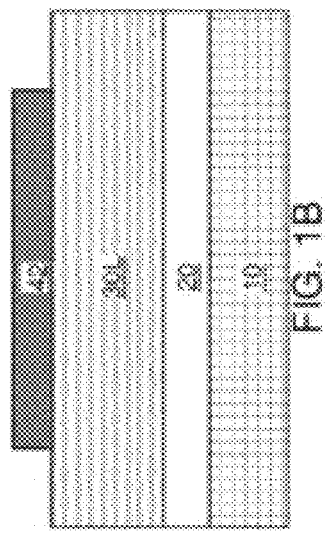
FIG. 1A is a top-down view of a first exemplary semiconductor structure after formation of a plurality of fin-defining mask structures over a support including a vertical stack, from bottom to top, of a substrate, an insulator layer, and a top semiconductor layer according to the present disclosure.

As stated above, the present disclosure relates to fin field effect transistors (finFETs) and a method of manufacturing the same. Aspects of the present disclosure are now described in detail with accompanying figures. It is noted that like reference numerals refer to like elements across different embodiments. The drawings are not necessarily drawn to scale.

Figure 1B:
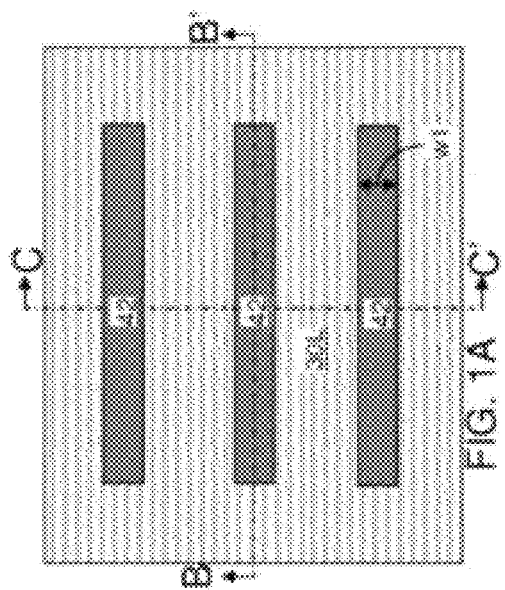
FIG. 1B is a vertical cross-sectional view of the first exemplary semiconductor structure along the vertical plane B-B' of FIG. 1A.
Figure 1C:
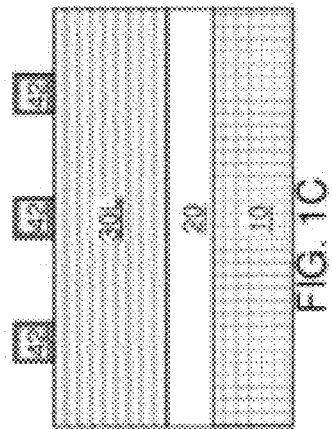
FIG. 1C is a vertical cross-sectional view of the first exemplary semiconductor structure along the vertical plane C-C' of FIG. 1A.

Referring to FIGS. 1A-1C, an exemplary semiconductor structure according to the present disclosure includes a vertical stack of a substrate 10, and an insulator layer 20, and a semiconductor layer 30L.

The substrate 10 can include a semiconductor material, an insulator material, or a conductive material. The substrate 10 provides mechanical support to the insulator layer 20 and the semiconductor layer 30L. The substrate 10 can be single crystalline, polycrystalline, or amorphous. The thickness of the substrate 10 can be from 50 microns to 2 mm, although lesser and greater thicknesses can also be employed.

The insulator layer 20 includes a dielectric material. Non-limiting examples of the insulator layer 20 include silicon oxide, silicon nitride, sapphire, and combinations or stacks thereof. The thickness of the insulator layer 20 can be, for example, from 100 nm to 100 microns, although lesser and greater thicknesses can also be employed. The substrate 10 and the insulator layer 20 collectively function as a support on which the semiconductor layer 30L is located.

The semiconductor layer 30L includes a semiconductor material. The semiconductor material of the semiconductor layer 30L can be an elemental semiconductor material, an alloy of at least two elemental semiconductor materials, a compound semiconductor material, or a combination thereof. The semiconductor layer 30L can be intrinsic or doped with electrical dopants of p-type or n-type. The semiconductor material of the semiconductor layer 30L can be single crystalline or polycrystalline. In one embodiment, the semiconductor layer 30L can be a single crystalline semiconductor layer. In one embodiment, the semiconductor material of the semiconductor layer 30L can be single crystalline silicon. The thickness of the semiconductor layer 30L can be, for example, from 10 nm to 300 nm, although lesser and greater thicknesses can also be employed.

A plurality of fin-defining mask structures 42 is formed over the semiconductor layer 30L. The plurality of fin-defining mask structures 42 is a set of mask structures that cover the regions of the semiconductor layer 30L that are subsequently converted into semiconductor fins. Thus, the plurality of fin-defining mask structures 42 is subsequently employed to define the area of the semiconductor fins. The plurality of fin-defining mask structures 42 can include a dielectric material such as silicon nitride, silicon oxide, and silicon oxynitride. In one embodiment, the plurality of fin-defining mask structures 42 can includes a material selected from an undoped silicate glass (USG), a fluorosilicate glass (FSG), a phosphosilicate glass (PSG), a borosilicate glass (BSG), and a borophosphosilicate glass (BPSG).

The plurality of fin-defining mask structures 42 can be formed, for example, by depositing a planar dielectric material layer and lithographically patterning the dielectric material layer. The planar dielectric material layer can be deposited, for example, by physical vapor deposition (PVD), chemical vapor deposition (CVD), and/or other suitable methods for depositing a dielectric material. The thickness of the planar dielectric material layer can be from 5 nm to 100 nm, although lesser and greater thicknesses can also be employed.

The planar dielectric material layer can be subsequently patterned to form the plurality of fin-defining mask structures 42. In one embodiment, each fin-defining mask structure 42 can laterally extend along a lengthwise direction. Further, each fin-defining mask structure 42 can have a pair of sidewalls that are separated along a widthwise direction, which is perpendicular to the lengthwise direction. In one embodiment, each fin-defining mask structure 42 can have a rectangular horizontal cross-sectional area. In one embodiment, each fin-defining mask structures 42 can have the same width w1.

Figure 2B:
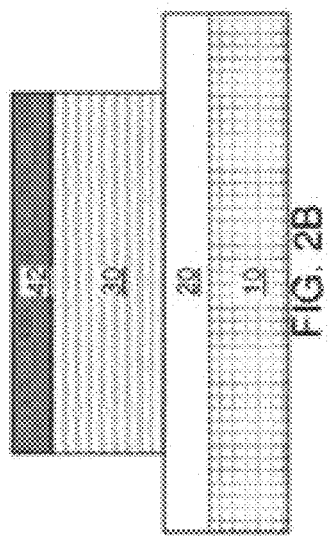
FIG. 2B is a vertical cross-sectional view of the first exemplary semiconductor structure along the vertical plane B-B' of FIG. 2A.
Figure 2A:
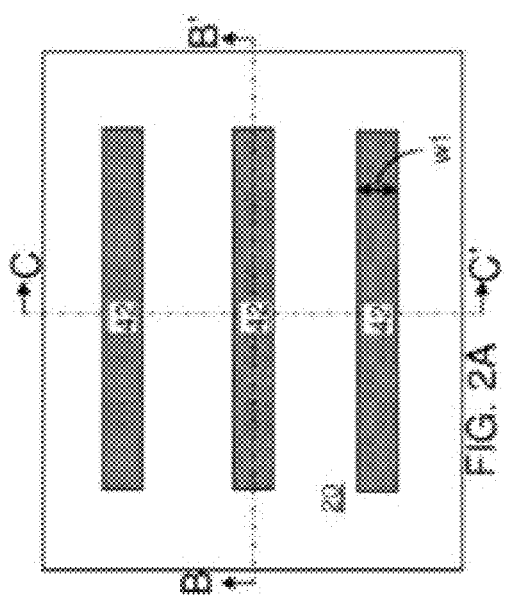
FIG. 2A is a top-down view of the first exemplary semiconductor structure after formation of semiconductor fins having substantially vertical sidewalls employing an anisotropic etch according to the present disclosure.
Figure 2C:
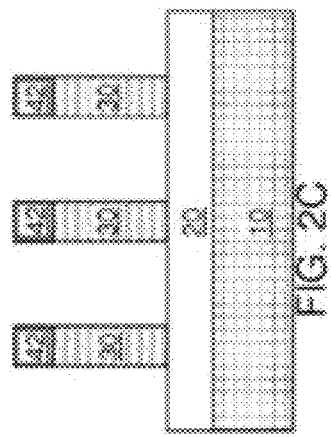
FIG. 2C is a vertical cross-sectional view of the first exemplary semiconductor structure along the vertical plane C-C' of FIG. 2A.

Referring to FIGS. 2A-2C, the semiconductor layer 30L is patterned to form a plurality of semiconductor fins 30. The formation of the plurality of semiconductor fins 30 can be performed employing an anisotropic etch process, which can be a reactive ion etch. The plurality of semiconductor fins 30 has substantially same horizontal cross-sectional shapes as the fin-defining mask structures 42. As used herein, two shapes are "substantially same" if the differences between the two shapes is due to atomic level roughness and does not exceed 2 nm. The semiconductor layer 30L is etched employing the anisotropic etch process in which the plurality of fin-defining mask structures 42 is employed as an etch mask. The plurality of semiconductor fins 30 is formed on the insulator layer 20. In one embodiment, the plurality of semiconductor fins 30 can include a single crystalline semiconductor material, and can have the same width w1.

The sidewalls of each semiconductor fin 30 can be vertically coincident with sidewalls of an overlying fin-defining mask structure 42. As used herein, a first surface and a second surface are vertically coincident if the first surface and the second surface are within a same vertical plane. In one embodiment, the height of the plurality of semiconductor fins 30 can be greater than the width w1 of each semiconductor fin 30.

The plurality of semiconductor fins 30 has substantially vertical sidewalls. As used herein, a surface is "substantially vertical" if the difference between the surface and a vertical surface is due to atomic level roughness and does not exceed 2 nm. Each of the plurality of semiconductor fins 30 can be a single crystalline semiconductor fin that laterally extends along a lengthwise direction. As used herein, a "lengthwise direction" is a horizontal direction along which an object extends the most. A "widthwise direction" is a horizontal direction that is perpendicular to the lengthwise direction.

In one embodiment, each of the plurality of semiconductor fins 30 extends along the lengthwise direction with a substantially rectangular vertical cross-sectional shape. As used herein, a "substantially rectangular shape" is a shape that differs from a rectangular shape only due to atomic level roughness that does not exceed 2 nm. The substantially rectangular vertical cross-sectional shape is a shape within a plane including a vertical direction and a widthwise direction. The substrate 10 and the insulator layer 20 collectively functions as a substrate on which the plurality of semiconductor fins 30 is located. The substantially rectangular vertical cross-sectional shape adjoins a horizontal interface with a top surface of the combination of the insulator layer 20 and the substrate 10, i.e., the substrate (10, 20).

Figure 3A:
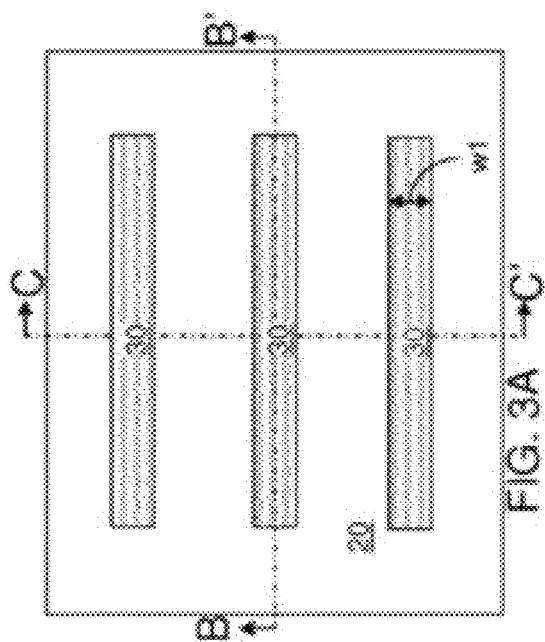
FIG. 3A is a top-down view of the first exemplary semiconductor structure after removal of the plurality of fin-defining mask structures according to the present disclosure.
Figure 3B:
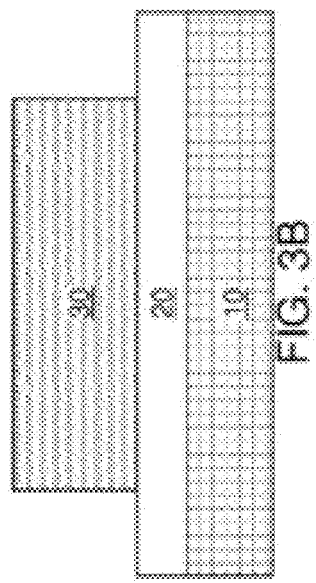
FIG. 3B is a vertical cross-sectional view of the first exemplary semiconductor structure along the vertical plane B-B' of FIG. 3A.
Figure 3C:
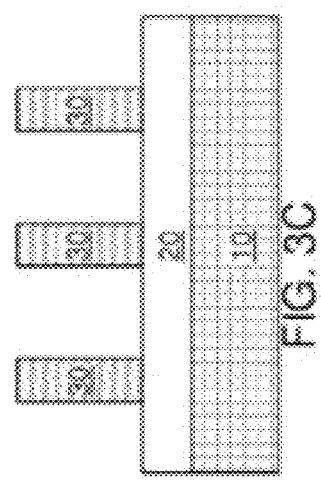
FIG. 3C is a vertical cross-sectional view of the first exemplary semiconductor structure along the vertical plane C-C' of FIG. 3A.
Figure 4B:
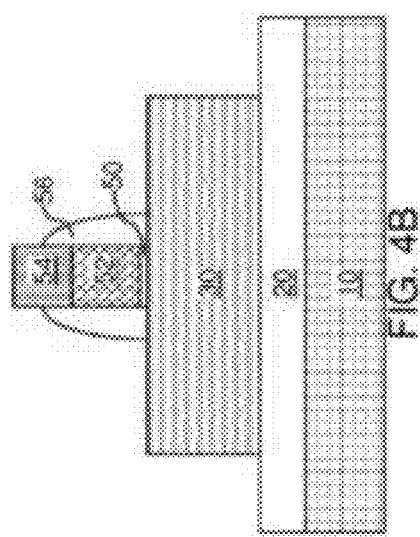
FIG. 4B is a vertical cross-sectional view of the first exemplary semiconductor structure along the vertical plane B-B' of FIG. 4A.
Figure 4D:
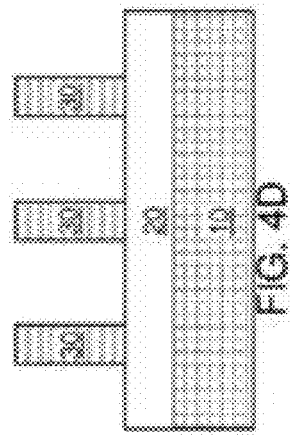
FIG. 4D is a vertical cross-sectional view of the first exemplary semiconductor structure along the vertical plane D-D' of FIG. 4A.
Figure 4A:
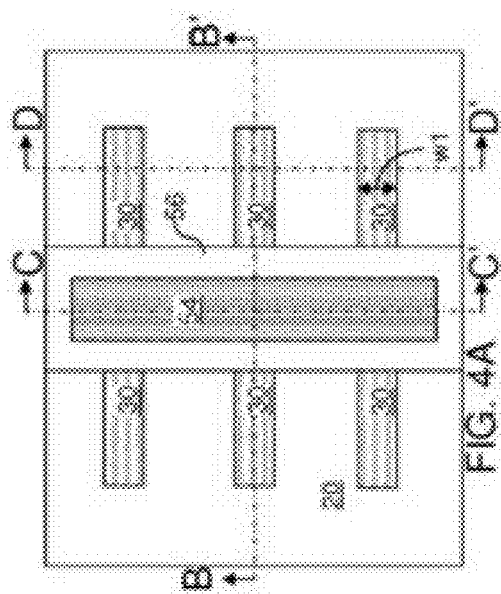
FIG. 4A is a top-down view of the first exemplary semiconductor structure after formation of a gate stack and a gate spacer according to the present disclosure.
Figure 4C:
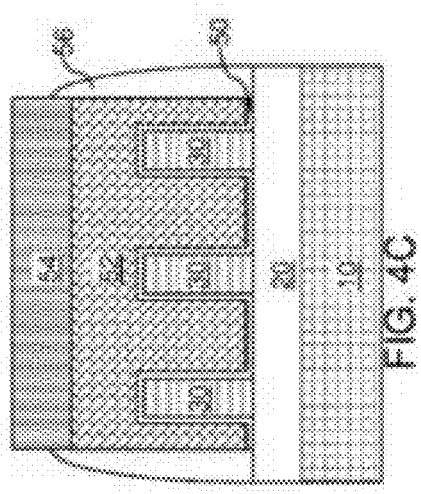
FIG. 4C is a vertical cross-sectional view of the first exemplary semiconductor structure along the vertical plane C-C' of FIG. 4A.

Referring to FIGS. 3A-3C, the plurality of fin-defining mask structures 42 can be removed selective to the plurality of semiconductor fins 30 by an etch process. The etch can be an isotropic etch or an anisotropic etch. The etch process can be selective, or non-selective, to the dielectric material of the insulator layer 20. In one embodiment, the plurality of fin-defining mask structures 42 can be removed selective to the plurality of semiconductor fins 30 and the insulator layer 20 employing a wet etch chemistry.

Referring to FIGS. 4A-4D, a gate stack including a gate dielectric 50, a gate electrode 52, and an optional gate cap dielectric 54 can be formed across the plurality of semiconductor fins 30 such that the gate stack (50, 52, 54) straddles each of the plurality of semiconductor fins 30. The gate dielectric 50 can include a silicon-oxide-based dielectric material such as silicon oxide or silicon oxynitride, or silicon nitride, and/or a dielectric metal oxide having a dielectric constant greater than 8.0 and is known as a high dielectric constant (high-k) dielectric material in the art. The thickness of the gate dielectric 50 can be in a range from 1 nm to 10 nm, although lesser and greater thicknesses can also be employed. The gate dielectric 50 is in contact with a top surface and sidewall surfaces of each semiconductor fin 30.

The gate electrode 52 can include a conductive material such as a doped semiconductor material, a metallic material, and/or a combination thereof. The gate electrode 52 is in contact with the gate dielectric 50. The gate cap dielectric 54 includes a dielectric material such as silicon oxide, silicon nitride, silicon oxynitride, or a combination thereof.

The formation of the gate dielectric 50, the gate electrode 52, and the optional gate cap dielectric 54 can be effected, for example, by deposition of a stack of a gate dielectric layer, a gate electrode layer, and a gate cap dielectric layer, and by subsequent patterning of the gate cap dielectric layer, the gate electrode layer, and the gate dielectric layer. The patterning of the gate cap dielectric layer and the gate electrode layer can be performed employing a combination of lithographic methods and at least one anisotropic etch. The patterning of the gate dielectric layer can be performed by an isotropic etch that is selective to the semiconductor material of the plurality of semiconductor fins 30.

A gate spacer 56 can be formed around the gate stack (50, 52, 54). The gate spacer 56 can be formed, for example, by depositing a conformal dielectric material layer on the plurality of semiconductor fins 30 and the gate stack (50, 52, 54), and anisotropically etching the conformal dielectric layer. The anisotropic etch includes an overetch component that removes vertical portions of the conformal dielectric material layer from the sidewalls of the plurality of semiconductor fins 30. An upper portion of the gate cap dielectric 54 can be vertically recessed during the over-etch of the conformal dielectric material layer. The remaining portions of the conformal dielectric material layer constitute the gate spacer 56, which laterally surrounds the gate stack (50, 52, 54).

Referring to FIGS. 5A-5D, a plurality of raised active regions (6S, 6D) are formed on the plurality of semiconductor fins 30. As used herein, a raised active region refers to a doped semiconductor material portion that protrudes above a topmost surface of an active region of a semiconductor device. As used herein, an active region refers to a semiconductor material portion within a semiconductor device through which charge carriers flow during operation of the semiconductor device. The plurality of raised active regions include raised source regions 6S that are formed on a source side of the semiconductor fins 30 with respect to the gate stack (50, 52, 54) and raised drain regions 6D that are formed on a drain side of the semiconductor fins 30 with respect to the gate stack (50, 52, 54).

The plurality of raised active regions (6S, 6D) is formed on outer sidewalls of the gate spacer 56. The plurality of semiconductor fins 30 can be a plurality of single crystalline semiconductor fins, and the plurality of raised active regions (6S, 6D) can be formed by selective epitaxy of a semiconductor material. Each of the plurality of raised active regions (6S, 6D) is epitaxially aligned to the corresponding semiconductor fin among the plurality of semiconductor fins (3S, 3D, 3B), i.e., the underlying semiconductor fin on which each raised active region (6S, 6D) epitaxially grows. In other words, the plurality of raised active regions (6S, 6D) is formed by a selective epitaxy process such that each of the plurality of raised active regions (6S, 6D) is in epitaxial alignment with an underlying single crystalline semiconductor fin. The material used to form the raised active regions 6S and 6D is silicon germanium (SiGe) wherein the amount of germanium is greater than 30 weight percent, or in embodiments greater than 40 weight percent, or greater than 60 weight percent. In embodiments, the material used to form the raised active regions can be pure germanium.

The duration of the selective epitaxy process can be controlled such that each of the plurality of raised active regions (6S, 6D) is laterally spaced from any other of the plurality of raised active regions (6S, 6D), i.e., does not merge with any other raised active region (6S, 6D). In one embodiment, the plurality of raised active regions (6S, 6D) can be formed with crystallographic facets. In one embodiment, the angles between the crystallographic facets of the raised active regions (6S, 6D) and a vertical line (i.e., a line that is perpendicular to the top surface of the insulator layer 20) can be greater than 0 degrees and less than 90 degrees for all facets formed on sidewalls of the plurality of semiconductor fins (3S, 3D, 3B). The total number of the raised active regions 6S can be the same as the total number of the source regions 3S, and the total number of the raised drain regions 6D can be the same as the total number of the drain regions 6D. Because the raised source regions 6S are not merged among one another, a physical gap exists between each neighboring pair of raised source regions 6S. Likewise, because the raised drain regions 6D are not merged among one another, a physical gap exists between each neighboring pair of raised drain regions 6D.

Figure 6:
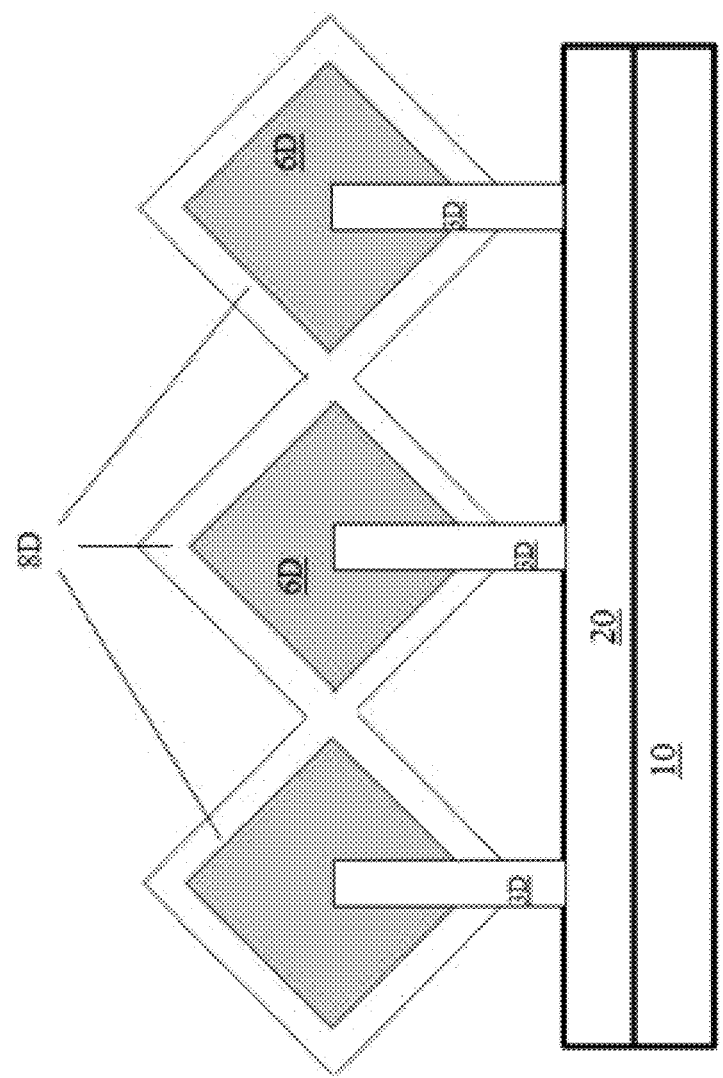
FIG. 6 is a vertical cross-sectional view of an exemplary semiconductor structure along the vertical plane after deposition of silicon regions of the embodiment shown in FIG. 5D.

Referring to FIG. 6, a cross-sectional view of silicon regions (8D) are formed on the plurality of raised active regions (6D). FIG. 6 shows the silicon regions formed on the fins 3D with raised active regions 6D corresponding to FIG. 5D. The formation of silicon regions 8D is through deposition. Deposition may include any now known or later developed techniques appropriate for the material to be deposited including but are not limited to, for example: chemical vapor deposition (CVD), low-pressure CVD (LPCVD), plasma-enhanced CVD (PECVD), semi-atmosphere CVD (SACVD) and high density plasma CVD (HDPCVD), rapid thermal CVD (RTCVD), ultra-high vacuum CVD (UHVCVD), limited reaction processing CVD (LRPCVD), metalorganic CVD (MOCVD), sputtering deposition, ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, evaporation.

Figure 5B:
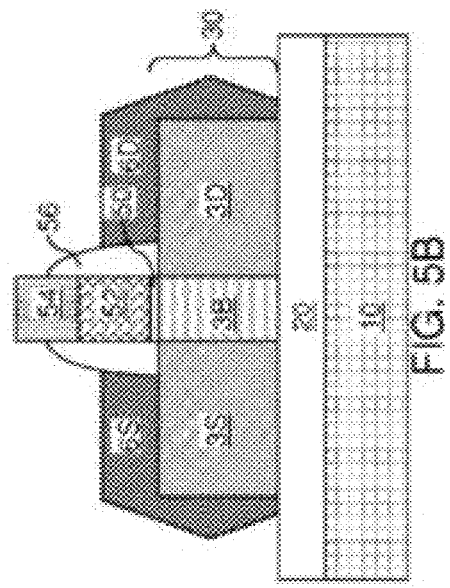
FIG. 5B is a vertical cross-sectional view of the first exemplary semiconductor structure along the vertical plane B-B' of FIG. 5A.
Figure 5D:
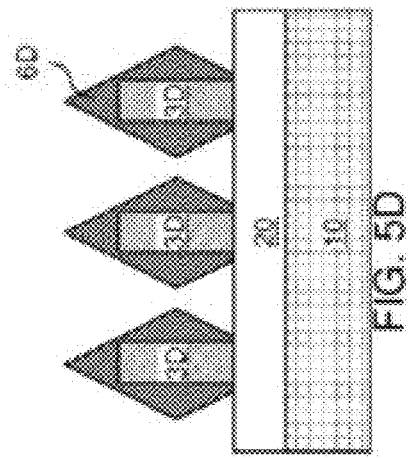
FIG. 5D is a vertical cross-sectional view of the first exemplary semiconductor structure along the vertical plane D-D' of FIG. 5A.
Figure 5A:
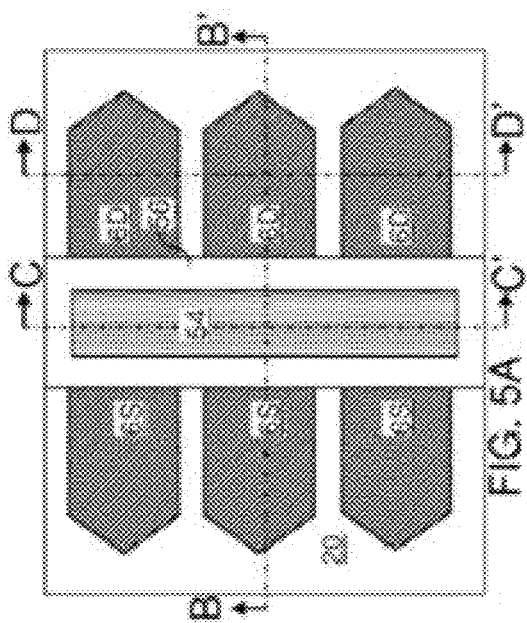
FIG. 5A is a top-down view of the first exemplary semiconductor structure after formation of raised active regions by selective epitaxy according to the present disclosure.
Figure 5C:
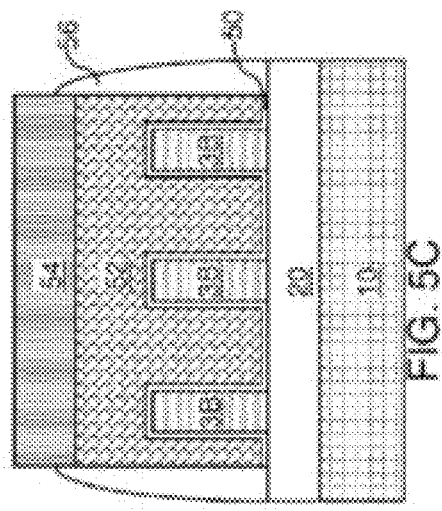
FIG. 5C is a vertical cross-sectional view of the first exemplary semiconductor structure along the vertical plane C-C' of FIG. 5A.

Likewise, silicon regions are formed on active regions 6S in FIG. 5A. In embodiments, the silicon regions 8D can merge adjacent active regions or they can be separate. As used herein, an element is merged if there exists a path contained entirely within the element for any pair of points within the element. Thus, each silicon region can be formed directly on the raised active regions (6S, 6D) of FIG. 5A.

Figure 7:
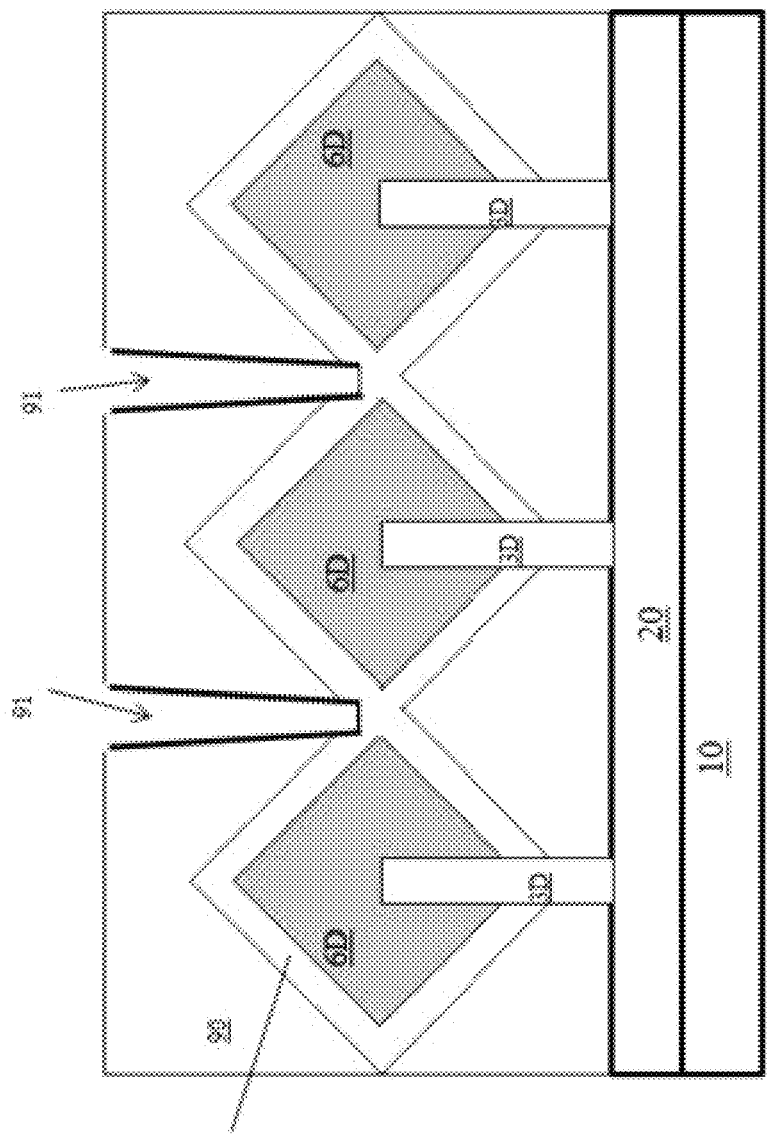
FIG. 7 is a vertical cross-sectional view of an exemplary semiconductor structure after gate dielectric deposition and replacement metal gate patterning of the embodiment shown FIG. 6.

FIG. 7. is a cross-sectional view illustrating deposition of a gate dielectric in a method of manufacturing a finFET device, according to an exemplary embodiment of the invention. After formation of the SiGe or pure Ge raised active areas 6D having a silicon cap 8D, a gate dielectric 90 is applied followed by replacement metal gate patterning. The dielectric 90 is deposited on upper surfaces of the fins 3D. After deposition of the dielectric 90, gate patterning is conducted through a selective etch to leave openings 91 for gate metallization. The gate dielectric material portion 90 can be a high k material having a dielectric constant greater than silicon oxide. Exemplary high k dielectrics include, but are not limited to, $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, SiON, $SiN_x$, a silicate thereof, and an alloy thereof. Each value of x is independently from 0.5 to 3 and each value of y is independently from 0 to 2. In some embodiments, a multilayered gate dielectric structure comprising different gate dielectric materials, e.g. silicon oxide, and a high k gate dielectric can be formed. The gate dielectric material portion can be formed by any deposition technique including, for example, chemical vapor deposition (CVD), plasma enhanced chemical vapor deposition (PECVD), physical vapor deposition (PVD), sputtering, and atomic layer deposition.

The gate openings 91 are then subjected to salication. This is performed using a metal selected from nickel, nickel platinum or cobalt. Silicide may be formed using any now known or later developed technique, e.g., performing an in-situ pre-clean, depositing a metal and annealing to have the metal react with silicon, and removing unreacted metal. During silicide formation, the nickel, nickel platinum or cobalt reacts rapidly with the silicon cap 8D (FIG. 7) but stops at silicon germanium 6D (FIG. 7). This minimizes encroachment of the silicide on the fins 3D. Such encroachment leads to shorts in the device. Therefore, the thin layer of silicon grown over the SiGe active regions allows for higher yields of the semiconductor devices. The annealing allows the nickel, nickel platinum or cobalt combine to form a silicide of nickel, nickel platinum or cobalt. In order to promote metal reaction with Si and minimize any reaction with SiGe, annealing should be performed at temperatures below 300° C. The duration of the annealing can be adjusted to maximize the metal diffusion along the Si cap and wrap around the fin structures. Silicide contact resistance will be lower proportionally to the silicided area. In one specific embodiment, the annealing temperature is 250° C. and the duration is two minutes. A selective etch is conducted to remove the silicide from the side walls of opening 91. The silicide layer 92 is shown in FIG. 8. as the darker shaded area.

Figure 8:
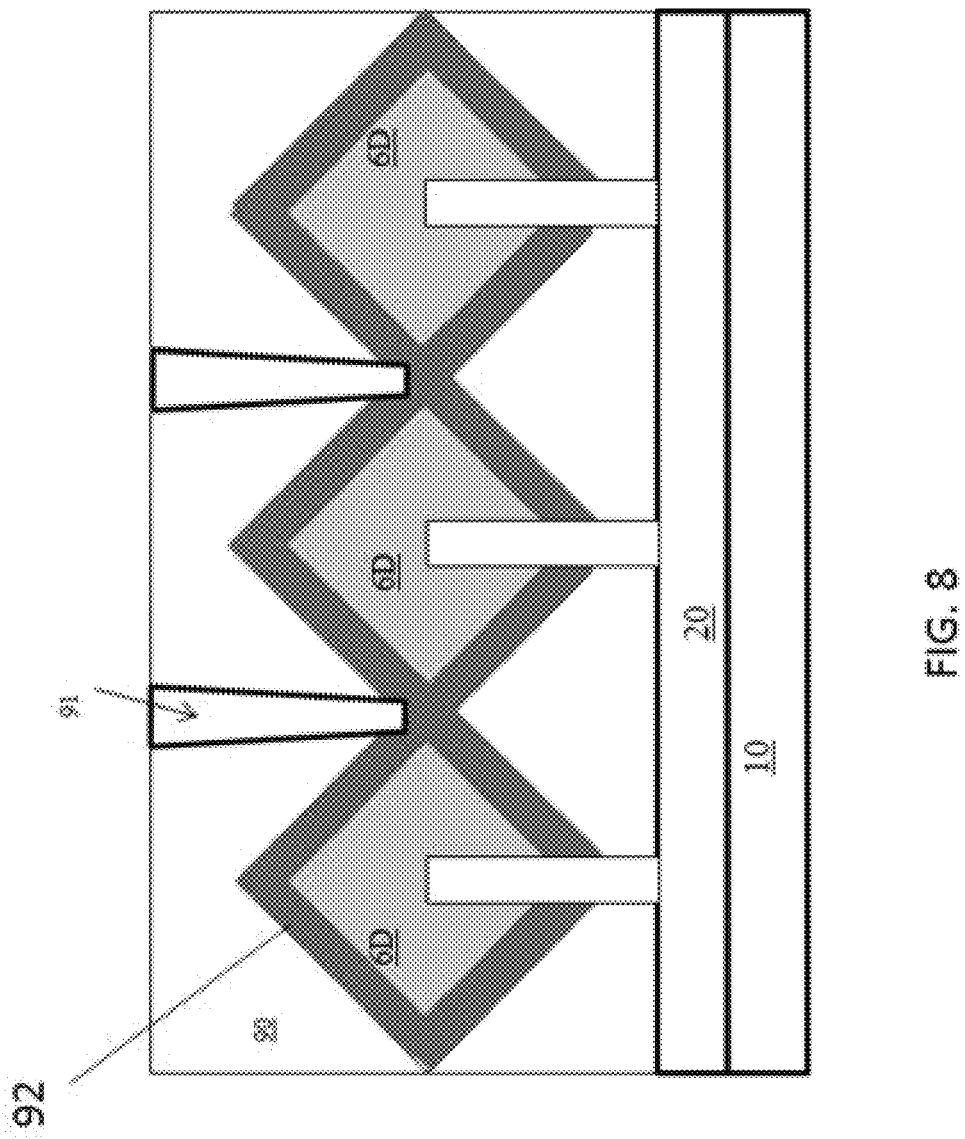
FIG. 8 is a vertical cross-sectional view of the exemplary semiconductor structure after salicidation of the embodiment shown FIG. 7.

FIG. 8 shows complete wrap around of the silicide layer 92. In embodiments, complete wrap around of the silicide layer 92 does not occur. However, even without complete wrap around of the silicide layer, the structure provide a long contact area.

Figure 9:
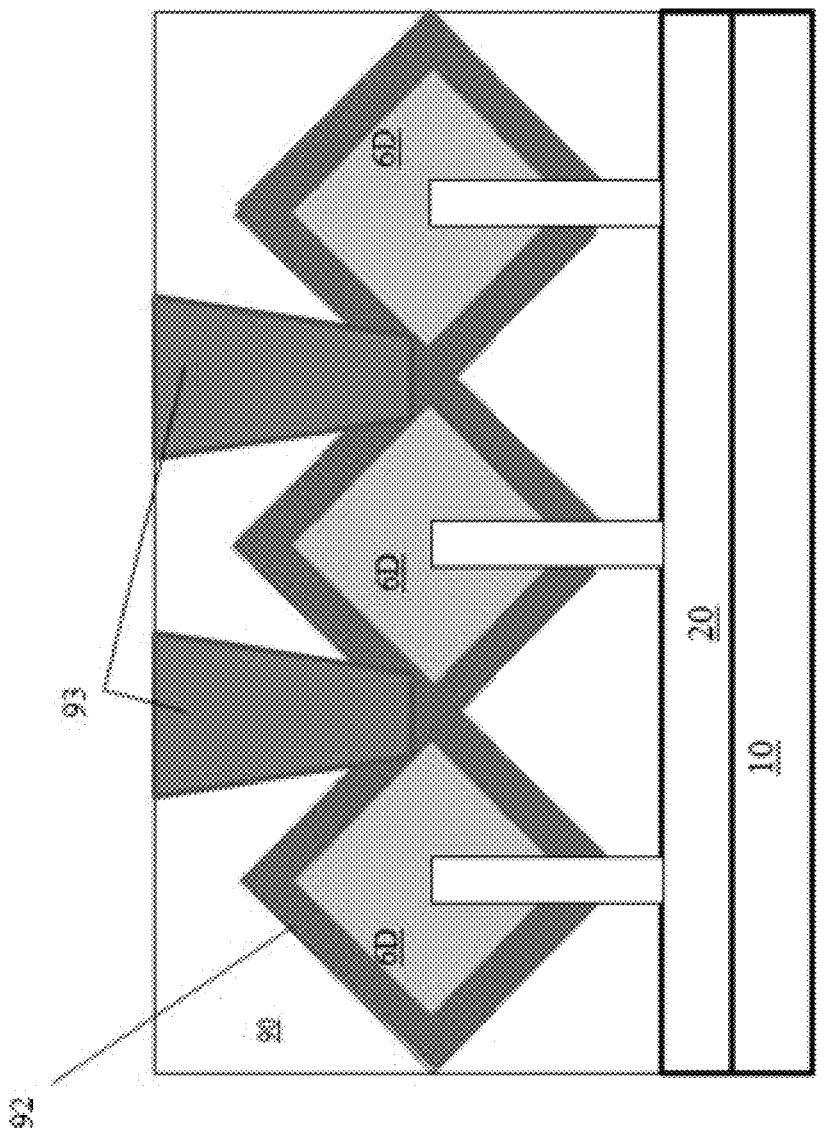
FIG. 9 is a vertical cross-sectional view of the exemplary semiconductor structure after deposition of metal vias of the embodiment shown FIG. 8.

Deposition of metal vias is then conducted as shown in FIG. 9. The gate metal 93 can be formed atop the gate dielectric material salicidation layer 92 portion and filling the remaining space of each gate cavity 91. The gate metal 93 can include any conductive metal material including, for example, an elemental metal (e.g., tungsten, titanium, tantalum, aluminum, nickel, ruthenium, palladium and platinum), an alloy of at least two elemental metals, an elemental metal nitride (e.g., tungsten nitride, aluminum nitride, and titanium nitride), an elemental metal silicide (e.g., tungsten silicide, nickel silicide, and titanium silicide) and multilayered combinations thereof. The gate metal 93 can be formed utilizing a deposition process including, for example, chemical vapor deposition (CVD), plasma enhanced chemical vapor deposition (PECVD), physical vapor deposition (PVD), sputtering, atomic layer deposition (ALD) and other like deposition processes.

In a different embodiment, NFET and PFET devices may have different silicide contact materials, as well as different contact via structures. In a specific embodiment, NFET devices are covered with a hardmask such as SiN, and PFET vias are opened for silicidation. Silicidation can be performed as described above. Afterwards, the hardmask material is removed from NFET areas with an etch process selective to the silicide material formed in PFET devices. Subsequently, metallization will be performed simultaneously in NFET and PFET devices (e.g. Ti/TiN liner depositions followed by W fill process). In order to increase the contact area, the via opening along the gate direction should be longer in NFET devices compared to PFET devices.

Figure 10:
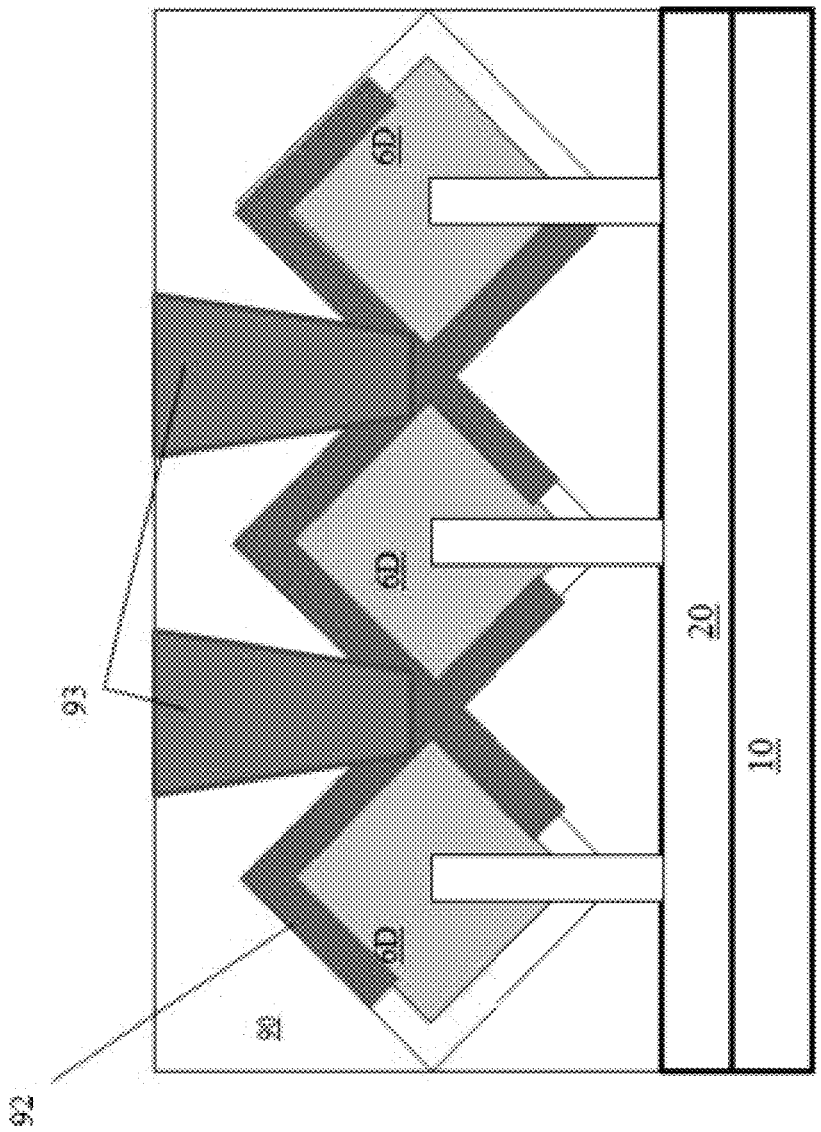
FIG. 10 is an embodiment of a vertical cross-sectional view of a semiconductor structure after deposition of metal vias.

FIG. 10 shows deposition of metal vias 93 in a structure that does not have complete wrap around of the silicide layer 92. The gate metal 93 can be formed atop the gate dielectric material salicidation layer 92 portion and filling the remaining space of each gate cavity 91. The gate metal 93 can include any conductive metal material including, for example, an elemental metal (e.g., tungsten, titanium, tantalum, aluminum, nickel, ruthenium, palladium and platinum), an alloy of at least two elemental metals, an elemental metal nitride (e.g., tungsten nitride, aluminum nitride, and titanium nitride), an elemental metal silicide (e.g., tungsten silicide, nickel silicide, and titanium silicide) and multilayered combinations thereof.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method of forming a semiconductor structure comprising:
    forming a plurality of semiconductor fins on a substrate;
    forming a plurality of raised active regions on said plurality of semiconductor fins, wherein each of the plurality of semiconductor fins underlies the plurality of raised active regions, wherein each raised active region of the plurality of raised active regions is laterally spaced from any other of the plurality of raised active regions and wherein each raised active region of the plurality of raised active regions comprises silicon germanium (SiGe) or pure germanium (Ge);
    forming a silicon cap over the plurality of raised active regions of the plurality of raised active regions;
    depositing a gate dielectric material over the plurality of raised active regions;
    etching gate openings between adjacent raised active regions of the plurality of raised active regions having the silicon cap;
    forming a merged contiguous metal semiconductor alloy selected from the group consisting of nickel silicide, nickel-platinum silicide and cobalt silicide through salicidation of the silicon cap through the gate openings wherein the merged contiguous metal semiconductor contacts a surface of at least two adjacent raised active regions of the plurality of raised active regions and the forming of the merged contiguous metal semiconductor alloy comprises a silicidation annealing that is performed at a temperature below 300° C.; and
    depositing metal vias in the gate openings.

2. The method of claim 1, wherein the contiguous metal semiconductor alloy region does not completely wrap around raised active regions.

3. The method of claim 1, wherein said plurality of said raised active regions is formed by selective epitaxy on the silicon.

4. The method of claim 1, wherein said plurality of said raised active regions is formed with crystallographic facets.

5. The method of claim 1, wherein said plurality of raised active regions and said metal semiconductor alloy region is at an angle that is greater than 0 degree and less than 90 degree with respect to a vertical of said plurality of semiconductor fins.

6. The method of claim 1, wherein each of said plurality of raised active regions is epitaxially aligned to said corresponding semiconductor fin among said plurality of semiconductor fins.

7. A method of forming a semiconductor structure comprising:
    forming a plurality of semiconductor fins on a substrate;
    forming raised active regions on said plurality of semiconductor fins, wherein each of the raised active regions is laterally spaced from any other raised active regions and wherein each raised active region comprises silicon germanium (SiGe) or germanium (Ge);
    forming a silicon cap over the raised active regions;
    depositing a gate dielectric material over the raised active regions;
    etching gate openings between adjacent raised active regions having the silicon cap;
    forming a contiguous metal semiconductor alloy selected from the group consisting of nickel silicide, nickel-platinum silicide and cobalt silicide through salicidation of the silicon cap through the gate openings, and wherein the forming of the contiguous metal semiconductor alloy comprises a silicidation annealing that is performed at a temperature below 300° C.; and
    depositing metal vias in the gate openings.

8. The method of claim 7, wherein the contiguous metal semiconductor alloy region does not completely wrap around raised active regions.

9. The method of claim 7, wherein each of the raised active regions is formed by selective epitaxy.

10. The method of claim 7, wherein each of the raised active regions is formed with crystallographic facets.

11. The method of claim 7, wherein adjacent raised active regions are merged.

12. A method of forming a semiconductor structure comprising:
    forming a plurality of semiconductor fins on an insulator layer, wherein the insulator layer entirely separates the semiconductor fins from an underlying substrate;
    forming a plurality of raised active regions on said plurality of semiconductor fins, wherein each of the plurality of semiconductor fins underlies the plurality of raised active regions, wherein each raised active region of the plurality of raised active regions is laterally spaced from any other of the plurality of raised active regions and wherein each raised active region of the plurality of raised active regions comprises silicon germanium (SiGe) or pure germanium (Ge);
    forming a silicon cap over the plurality of raised active regions of the plurality of raised active regions, wherein the silicon cap is entirely spaced apart from a topmost surface of the insulator layer;
    depositing a gate dielectric material over the plurality of raised active regions;
    etching gate openings between adjacent raised active regions of the plurality of raised active regions having the silicon cap;
    forming a merged contiguous metal semiconductor alloy selected from the group consisting of nickel silicide, nickel-platinum silicide and cobalt silicide through salicidation of the silicon cap through the gate openings wherein the merged contiguous metal semiconductor contacts a surface of at least two adjacent raised active regions of the plurality of raised active regions; and
    depositing metal vias in the gate openings.

* * * * *